US008389857B2

(12) United States Patent
Petrillo

(10) Patent No.: US 8,389,857 B2
(45) Date of Patent: Mar. 5, 2013

(54) STRUCTURE FOR MOUNTING A WIRELESS BATTERY-POWERED REMOTE CONTROL

(75) Inventor: David William Petrillo, Bethlehem, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 438 days.

(21) Appl. No.: 12/772,502

(22) Filed: May 3, 2010

(65) Prior Publication Data

US 2011/0267802 A1 Nov. 3, 2011

(51) Int. Cl.
*H05K 5/03* (2006.01)

(52) U.S. Cl. ............... 174/66; 174/50; 174/53; 220/3.2; 220/3.3; 220/241; 248/309.1; 248/205.1

(58) Field of Classification Search .................... 174/66, 174/67, 53, 57, 58, 50, 559, 61; 362/85, 362/410; 248/309.1, 205.1, 309.4, 225.11; 220/241, 242, 3.2, 3.8
See application file for complete search history.

(56) References Cited

U.S. PATENT DOCUMENTS 4,835,343 A 5/1989 Graef et al.
5,026,016 A * 6/1991 Lisowski ................. 248/225.11
5,458,311 A * 10/1995 Holbrook ................... 248/309.1
5,905,442 A 5/1999 Mosebrook et al.
6,135,408 A * 10/2000 Richter ....................... 248/309.4
6,769,658 B2 * 8/2004 Stokes ........................ 248/309.1
7,954,773 B2 * 6/2011 Carnevali ................... 248/309.1
2009/0251352 A1 10/2009 Altonen et al.

OTHER PUBLICATIONS

Lutron Radio Touch System Installation Guide, pp. 1, 2, 15 and 48 dated Mar. 2007.
Lutron Aurora Security Package Installation Guide, pp. front cover, 1, 2, 15, 18, rear cover, dated Jan. 2007.
Cooper Aspire Product Spec, dated 2008.

* cited by examiner

*Primary Examiner* — Angel R. Estrada
(74) *Attorney, Agent, or Firm* — Ostrolenk Faber LLP

(57) ABSTRACT

A mounting structure enables a portable remote control device, that operates a load control device of a wirelessly controlled lighting system, to be mounted to a vertical surface (e.g., to an opening of an electrical wallbox). The mounting structure comprises a mounting fixture for attaching to the vertical surface, an opening sized to receive the remote control device, and a flexible leaf in the opening that receives the remote control device. The flexible leaf may project upwardly in the opening for receiving a flanged recess of the remote control device disposed on a rear surface of the remote control device, whereby the remote control device can be slidably received on the flexible leaf and when fully received on the leaf is retained in position on the mounting structure such that the remote control device is framed by the opening in the mounting structure.

18 Claims, 11 Drawing Sheets

STRUCTURE FOR MOUNTING A WIRELESS BATTERY-POWERED REMOTE CONTROL

BACKGROUND OF THE INVENTION

1. Field of the Invention

The present invention relates to a wireless load control system for controlling the amount of power delivered to an electrical load from a source of alternating-current (AC) power, and more particularly, to a structure for mounting a remote control for such a radio-frequency (RF) lighting control system to the opening of a standard electrical wallbox.

2. Description of the Related Art

Control systems for controlling electrical loads, such as lights, motorized window treatments, and fans, are known. Such control systems often use radio-frequency (RF) transmission to provide wireless communication between the control devices of the system. One example of an RF lighting control system is disclosed in commonly-assigned U.S. Pat. No. 5,905,442, issued on May 18, 1999, entitled METHOD AND APPARATUS FOR CONTROLLING AND DETERMINING THE STATUS OF ELECTRICAL DEVICES FROM REMOTE LOCATIONS, the entire disclosure of which is hereby incorporated by reference.

The RF lighting control system of the '442 patent includes wall-mounted load control devices (e.g., dimmers), and a plurality of remote control devices (e.g., table-top and wall-mounted master controls), and car visor controls. The control devices of the RF lighting control system include RF antennas adapted to transmit and receive the RF communication signals that provide for communication between the control devices of the lighting control system. To prevent interference with other nearby RF lighting control systems located in close proximity, the control devices of the RF lighting control system stores in memory and uses an identical house code (i.e., a house address). Each of the control devices is also assigned a unique device address to allow for the transmission of the RF communication signals between specific control devices. The lighting control system also comprises signal repeaters, which help to ensure error-free communication by repeating the RF signals to ensure that every device of the system reliably receives the RF signals.

Each of the load control devices includes a user interface and an integral dimmer circuit for controlling the intensity of an attached lighting load. The user interface has a pushbutton actuator for providing on/off control of the attached lighting load and a raise/lower actuator for adjusting the intensity of the attached lighting load. The load control devices may be programmed with a preset lighting intensity that may be recalled later in response to an actuation of a button of the user interface or a received RF signal. The table-top and wall-mounted master controls each have a plurality of buttons and are operable to transmit RF signals to the load control devices to control the intensities of the lighting loads. Each of the table-top and wall-mounted master controls may also comprise one or more visual indicators, e.g., light-emitting diodes (LEDs), for providing feedback to a user in response to a received RF signal. The car visor controls may be clipped to the visor of an automobile and include three buttons for respectively controlling the lighting loads to one of a maximum intensity, a minimum intensity (i.e., off), and a preset lighting level.

In addition, some lighting control systems may include portable hand-held RF remote controls. It is desirable to mount such a remote control to a vertical surface, such as a wall, in the opening of a faceplate. An example of such a faceplate is described in greater detail in U.S. Pat. No. 4,835,343, issued May 30, 1989, entitled TWO-PIECE FACE PLATE FOR WALL BOX MOUNTED DEVICE, the entire disclosure of which is hereby incorporated by reference. Therefore, there is a need for a structure for mounting the remote control to the wall or to the opening of a standard electrical wallbox, and which could also be ganged into a multigang electrical wallbox, if desired.

SUMMARY OF THE INVENTION

According to an embodiment of the present invention, a mounting structure for mounting a remote control device to a vertical surface is provided. The remote control device that operates a load control device of a wirelessly controlled lighting control system. The mounting structure comprises a mounting fixture for attaching to the electrical wallbox, an opening sized to receive the remote control device, and a flexible leaf in the opening that receives the remote control device whereby the remote control device is retained in position on the mounting structure such that the remote control device is framed by the opening in the mounting structure. In accordance with a particular embodiment, the flexible leaf projects upwardly in the opening for receiving a flanged recess of the remote control device disposed on a rear surface of the remote control device, whereby the remote control device is slidably received on the flexible leaf and when fully received on the leaf is retained in position on the mounting structure such that the remote control device is framed by the opening in the mounting structure.

According to another embodiment of the present invention, a control structure comprises: (1) a remote control adapted to operate a load control device of a wirelessly controlled lighting control system; (2) a mounting fixture adapted to be attached to a vertical surface; (3) an opening sized to receive the remote control device; and (4) a flexible leaf in the opening that receives the remote control device whereby the remote control device is retained in position such that the remote control device is framed by the opening in the mounting structure.

Other features and advantages of the present invention will become apparent from the following description of the invention that refers to the accompanying drawings.

DETAILED DESCRIPTION OF THE INVENTION

Figure 1:
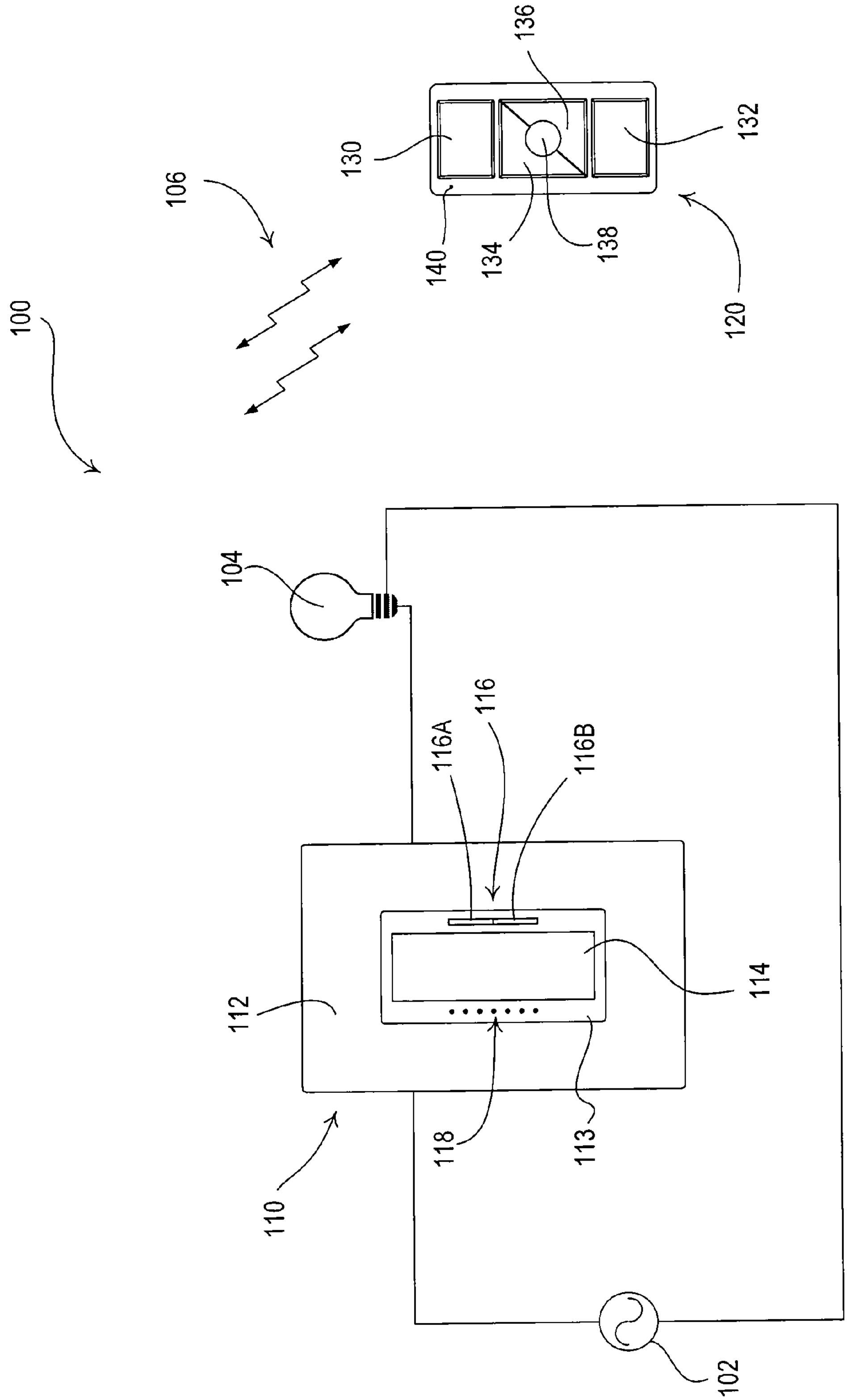
FIG. 1 is a simplified diagram of an RF lighting control system comprising a dimmer switch and a remote control.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

FIG. 1 is a simple diagram of an RF load control system 100 comprising a remotely-controllable load control device (e.g., a dimmer switch 110) and a remote control 120. The dimmer switch 110 is adapted to be wall-mounted in a standard electrical wallbox. The dimmer switch 110 is coupled in series electrical connection between an AC power source 102 and an electrical lighting load 104 for controlling the amount of power delivered to the lighting load. The dimmer switch 110 comprises a faceplate 112 and a bezel 113 received in an opening of the faceplate. Alternatively, the RF lighting control system 100 may comprise another type of remotely-controllable load control device, for example, a remotely-controllable electronic dimming ballast, a remotely-controllable driver for a light-emitting diode (LED) light source, a dimmer circuit for other types of lighting loads (such as, magnetic low-voltage lighting loads, electronic low-voltage lighting loads, and screw-in compact fluorescent lamps), an electronic switch, a switching circuit including a relay, a controllable plug-in module adapted to be plugged into an electrical receptacle, a controllable screw-in module adapted to be screwed into the electrical socket (e.g., an Edison socket) of a lamp, a motor control device, a motorized window treatment (such as, a roller shade or a drapery), a temperature control device, or an audio/visual control device.

The dimmer switch 110 comprises a toggle actuator 114 (i.e., a control button) and an intensity adjustment actuator 116 (e.g., a rocker switch). Actuations of the toggle actuator 114 toggle, i.e., alternately turn off and on, the lighting load 104. The dimmer switch 110 may be programmed with a lighting preset intensity (i.e., a “favorite” intensity level), such that the dimmer switch is operable to control the intensity of the lighting load 104 to the preset intensity when the lighting load is turned on by an actuation of the toggle actuator 114. Actuations of an upper portion 116A or a lower portion 116B of the intensity adjustment actuator 116 respectively increase or decrease the amount of power delivered to the lighting load 104 and thus increase or decrease the intensity of the lighting load 104.

A plurality of visual indicators 118, e.g., light-emitting diodes (LEDs), are arranged in a linear array on the left-side of the bezel 113. The visual indicators 118 are illuminated to provide feedback of the present intensity of the lighting load 104. The dimmer switch 110 illuminates one of the plurality of visual indicators 118, which is representative of the present light intensity of the lighting load 104. An example of a dimmer switch having a toggle actuator 114 and an intensity adjustment actuator 116 is described in greater detail in U.S. Pat. No. 5,248,919, issued Sep. 29, 1993, entitled LIGHTING CONTROL DEVICE, the entire disclosure of which is hereby incorporated by reference.

Figure 2A:
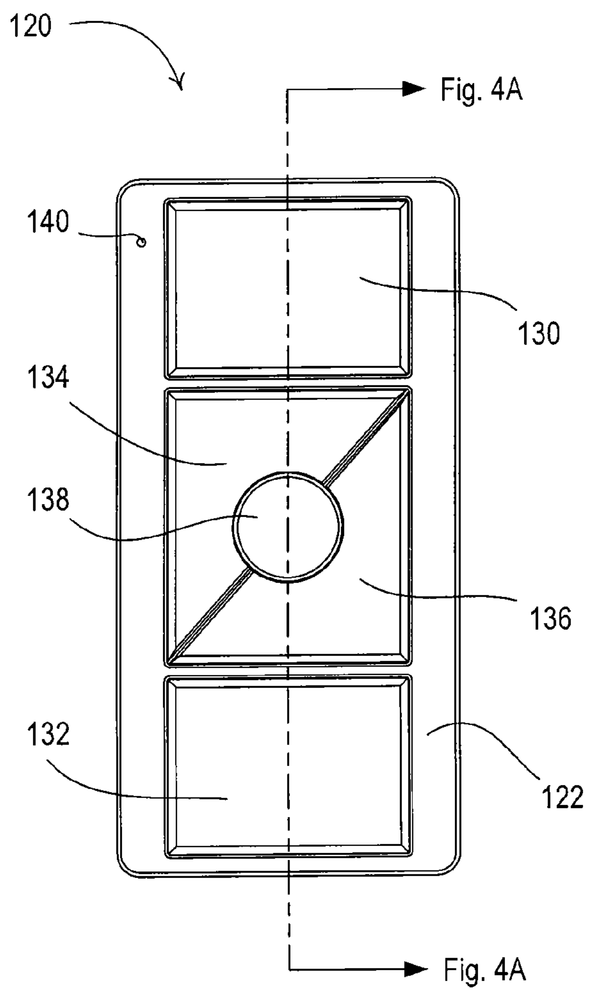
FIG. 2A is a front view of the remote control of the lighting control system of FIG. 1.
Figure 2B:
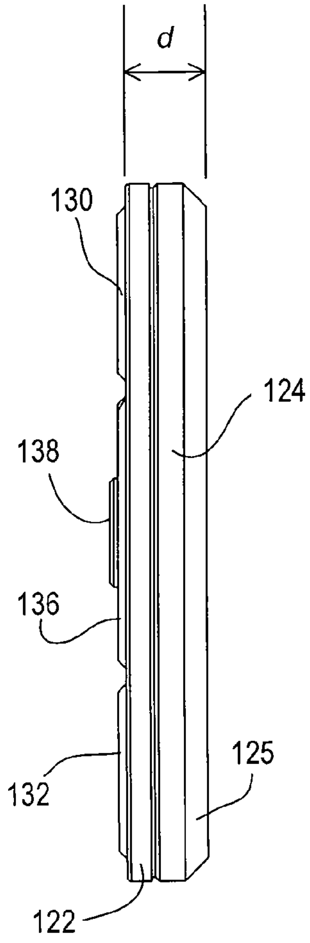
FIG. 2B is a right-side view of the remote control of the lighting control system of FIG. 1.

FIG. 2A is an enlarged front view and FIG. 2B is a right-side view of the remote control 120. The remote control 120 comprises a housing that includes a front enclosure portion 122 and a rear enclosure portion 124 (which has beveled edges 125). The remote control 120 further comprises a plurality of actuators (i.e., an on button 130, an off button 132, a raise button 134, a lower button 136, and a preset button 138). The remote control 120 also comprises a visual indicator 140, which is illuminated in response to the actuation of one of the buttons 130-138. The remote control 120 transmits packets (i.e., messages) via RF signals 106 (i.e., wireless transmissions) to the dimmer switch 110 in response to actuations of any of the actuators. A packet transmitted by the remote control 120 includes, for example, a preamble, a serial number associated with the remote control, and a command (e.g., on, off, or preset), and comprises 72 bits. In order to meet the standards set by the FCC, packets are transmitted such that there is not less than a predetermined time period between two consecutive packets, for example, approximately 100 msec.

Figure 3:
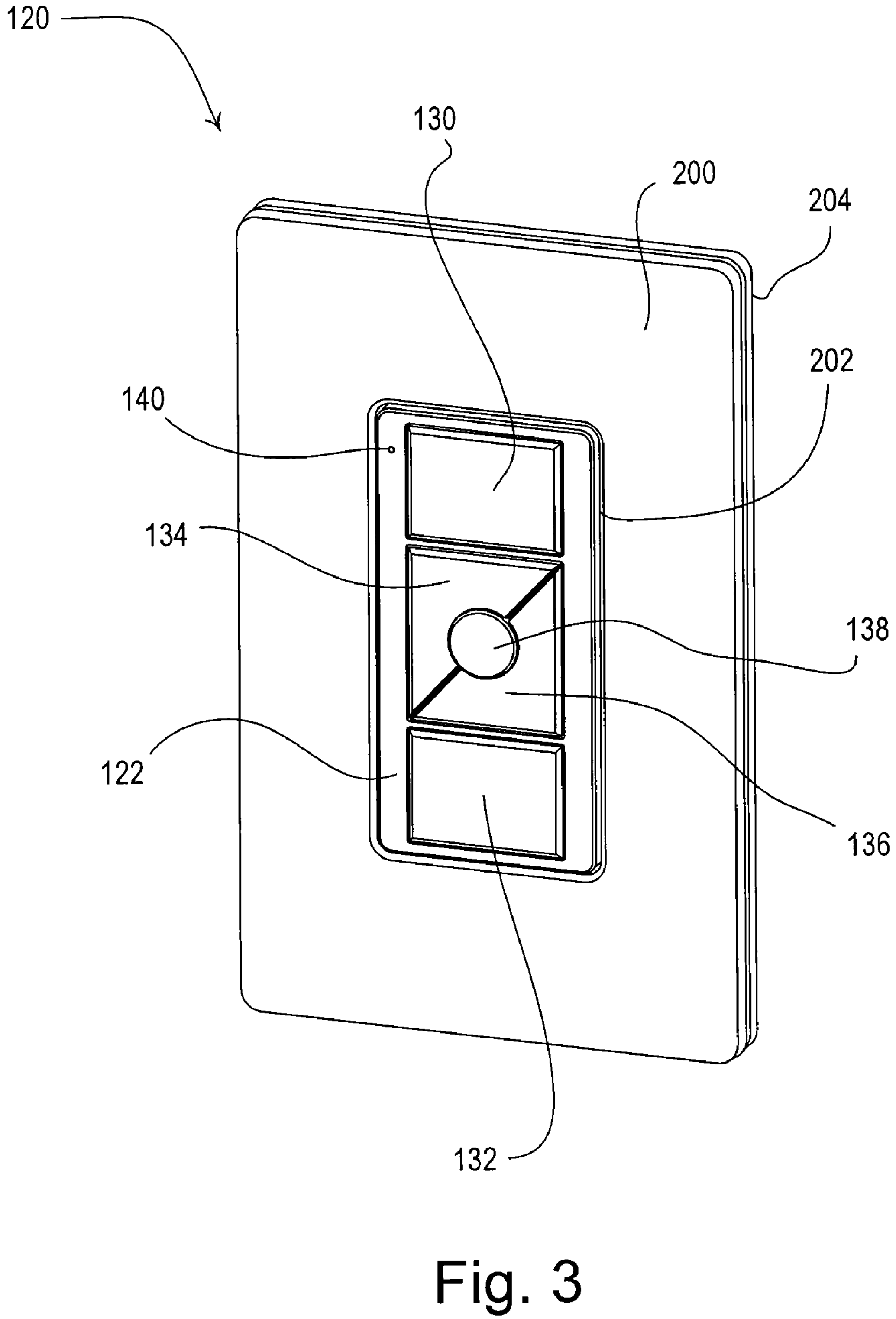
FIG. 3 is a front perspective view of the remote control of FIG. 1 mounted on a substantially-flat vertical surface, such as a wall, and disposed in accordance with the invention inside the opening of a standard-sized faceplate.
Figure 8:
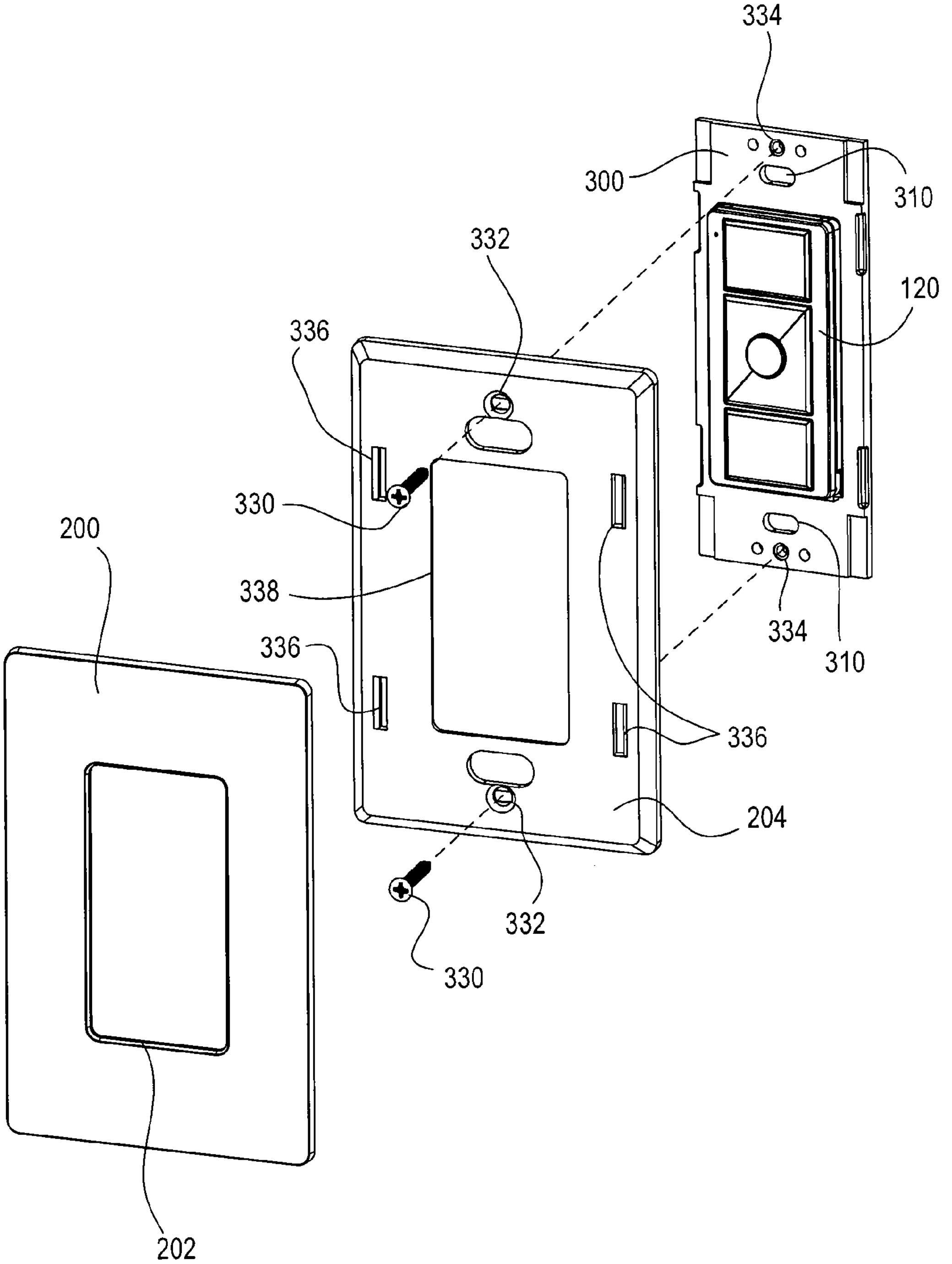
FIG. 8 is an exploded view of the remote control and the mounting structure (onto which the remote control is slidably received) according to the first embodiment, showing how a faceplate adaptor and faceplate are connected to the mounting structure.

FIG. 3 is a front perspective view of the remote control 120 mounted on a substantially flat vertical surface, such as, a wall, and received in an opening 202 of a faceplate 200. Specifically, the remote control 120 may be held in place by a mounting structure 300 (FIG. 5) according to a first embodiment of the present invention as will be described in greater detail below. The faceplate 200 connects (e.g., snaps) to an adaptor plate 204 (which is attached to the mounting structure 300 as shown in FIG. 8), such that the faceplate has an attractive aesthetic appearance and has no opening for attachments screws.

The faceplate 200 may be a standard, “off-the-shelf” faceplate, i.e., the opening 202 defines standard dimensions. For example, the faceplate 200 may comprise a designer-style faceplate defining a standard-sized opening. Per standards set by the National Electrical Manufacturers Association (NEMA), the opening of a designer-style faceplate has a length of 2.630" and a width of 1.310" (NEMA Standards Publication No. WD6, 2001, p. 5). Accordingly, the front enclosure portion 122 and the rear enclosure portion 124 of the remote control 120 are dimensioned such that the remote control 120 is adapted to fit snugly within the opening 202 of the faceplate 200. The outer periphery of the housing (i.e., the front enclosure portion 122 and the rear enclosure portion 124) has a length and a width slightly smaller than the length and the width of the opening 202 of the faceplate 200, such that the outer periphery of the housing is easily received within the opening of the faceplate. For example, the remote control 120 may have a length of approximately 2.605" and a width of approximately 1.280".

Further, the remote control 120 has a depth d (as shown in FIG. 2B), which is sized such that the front surface of the remote control is flush with or does not protrude very far past the front surface of the faceplate 200. Therefore, the depth d is approximately equal to the distance between the front surface of the faceplate 200 and the wall, e.g., less than approximately 0.5", or specifically, equal to approximately 0.3029".

Figure 4:
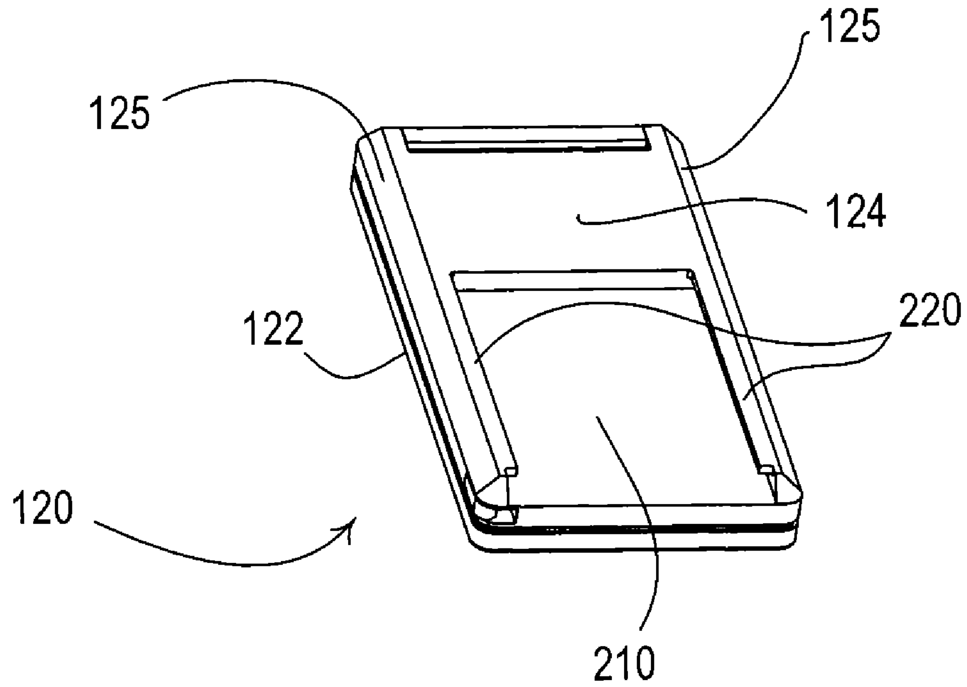
FIG. 4 is a rear perspective view of the remote control of FIG. 1.

FIG. 4 is a rear perspective view of the remote control 120. The rear enclosure portion 124 of the remote control 120 comprises a slide-receiving portion 210, which includes two parallel flanges 220. The slide-receiving portion 210 enables the remote control 120 to be coupled to the mounting structure 300 of the present invention as will be described in greater detail below. In addition, the slide-receiving portion 210 also enables the remote control 120 to be coupled to a plurality of alternative mounting structures (e.g., a clip or a table-top base support) as described in commonly-assigned U.S. patent application Ser. No. 12/399,126, filed Mar. 6, 2009, entitled BATTERY POWERED REMOTE CONTROL HAVING MULTIPLE MOUNTING MEANS, the entire disclosure of which is hereby incorporated by reference.

Figure 5:
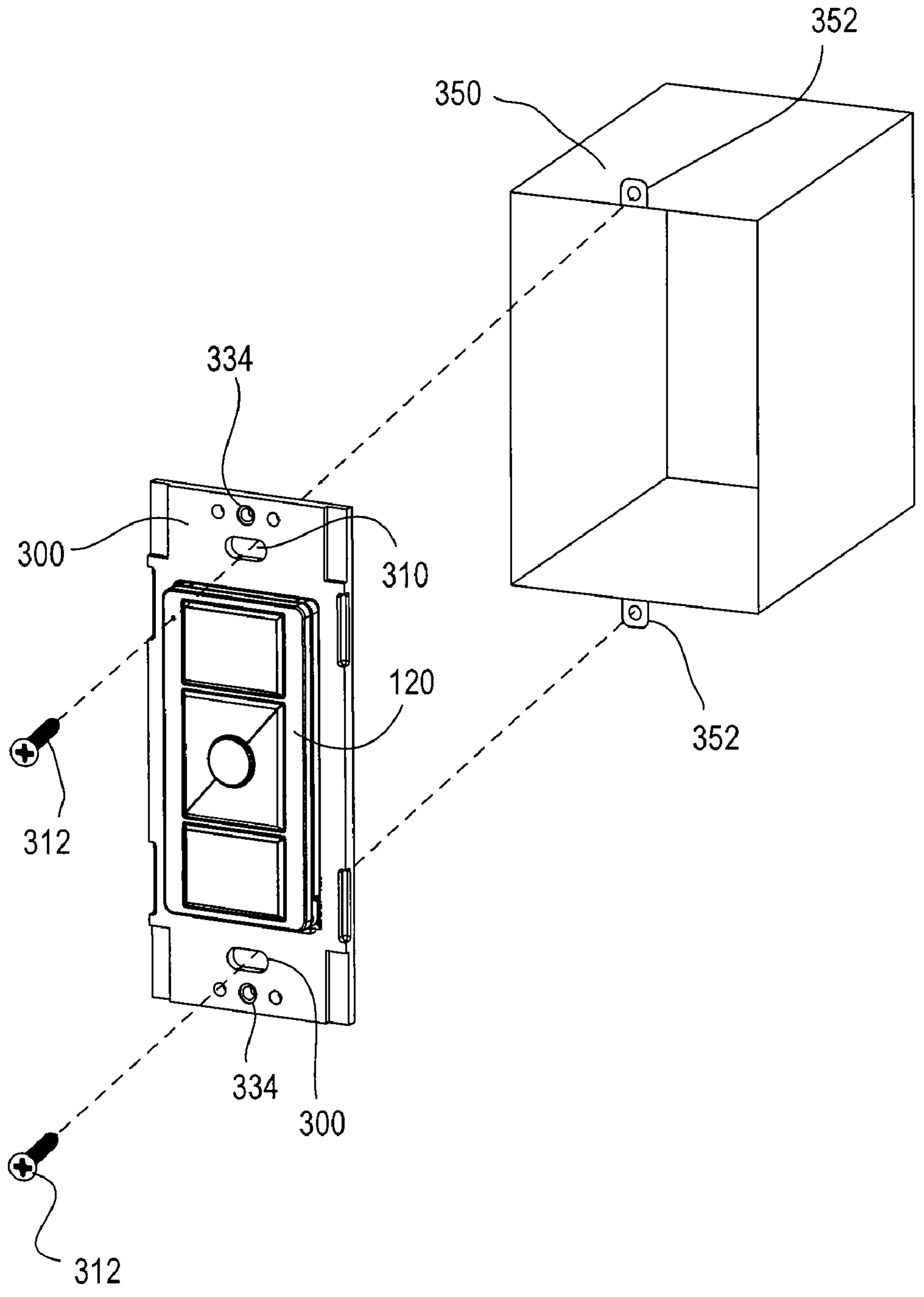
FIG. 5 is a perspective view of the remote control of FIG. 1 and a mounting structure according to a first embodiment of the present invention showing how the mounting structure may be mounted to an opening of a standard electrical wallbox, the wallbox mounted to the vertical surface.
Figure 6:
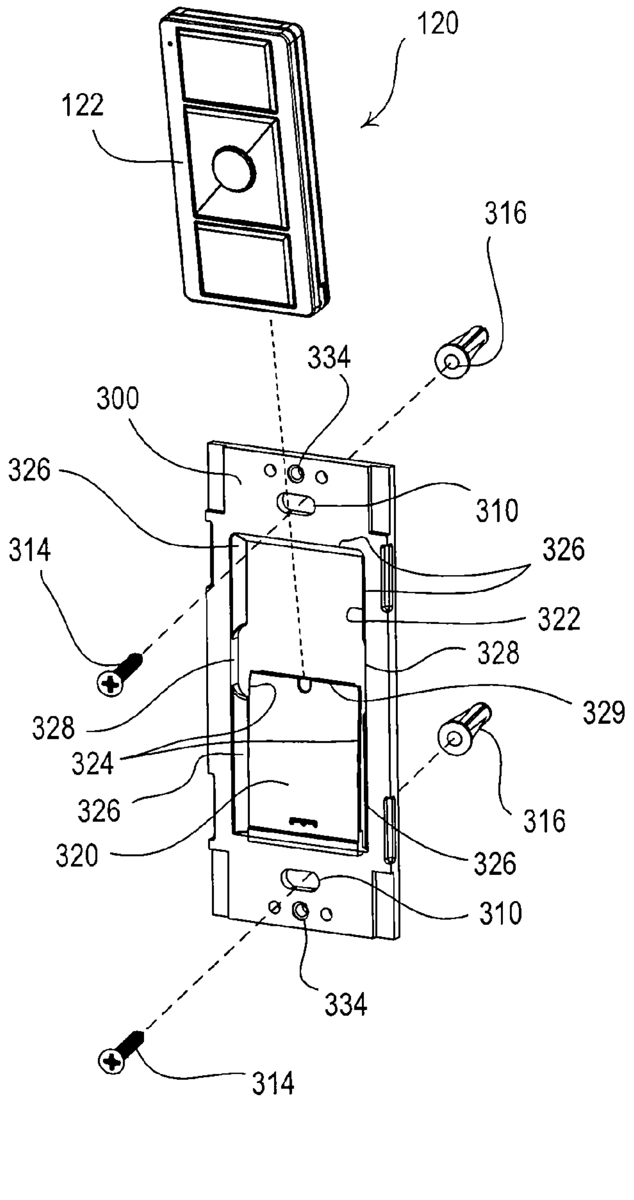
FIG. 6 is a perspective view of the remote control of FIG. 1 and the mounting structure of the first embodiment showing how the mounting structure may be mounted directly to the vertical surface.

FIGS. 5-8 show details of the mounting structure 300 according to the first embodiment of the present invention. The mounting structure 300 may be mounted to an electrical wallbox 350 that is connected into a building wall structure by conventional means. The electrical wallbox 350 includes typical ears 352 that receive screws that fasten to the mounting structure 300 to the wallbox (as shown in FIG. 5). The mounting structure 300 includes a mounting fixture in the form of openings 310 through which mounting screws 312 extend to secure the mounting structure to the ears 352 of the electrical wallbox 350. Alternatively, the mounting structure 300 could be mounted to a flat surface, such as a wall, via mounting screws 314 received through anchors 316 (as shown in FIG. 6).

The mounting structure 300 includes a flexible integrally-formed leaf 320 in an opening 322 on which the slide-receiving portion 210 of the rear enclosure portion 124 of the remote control 120 is slidably fastenable as shown in FIG. 6. In particular, the two parallel flanges 220 of the slide-receiving portion 210 of the remote control 120 form channels for slidably receiving two vertical edges 324 of the leaf 320. The flexible leaf 320 is reduced in thickness at the vertical edges 324 so as to receive the channels of the slide-receiving portion 210 of the remote control 120.

Figure 9A:
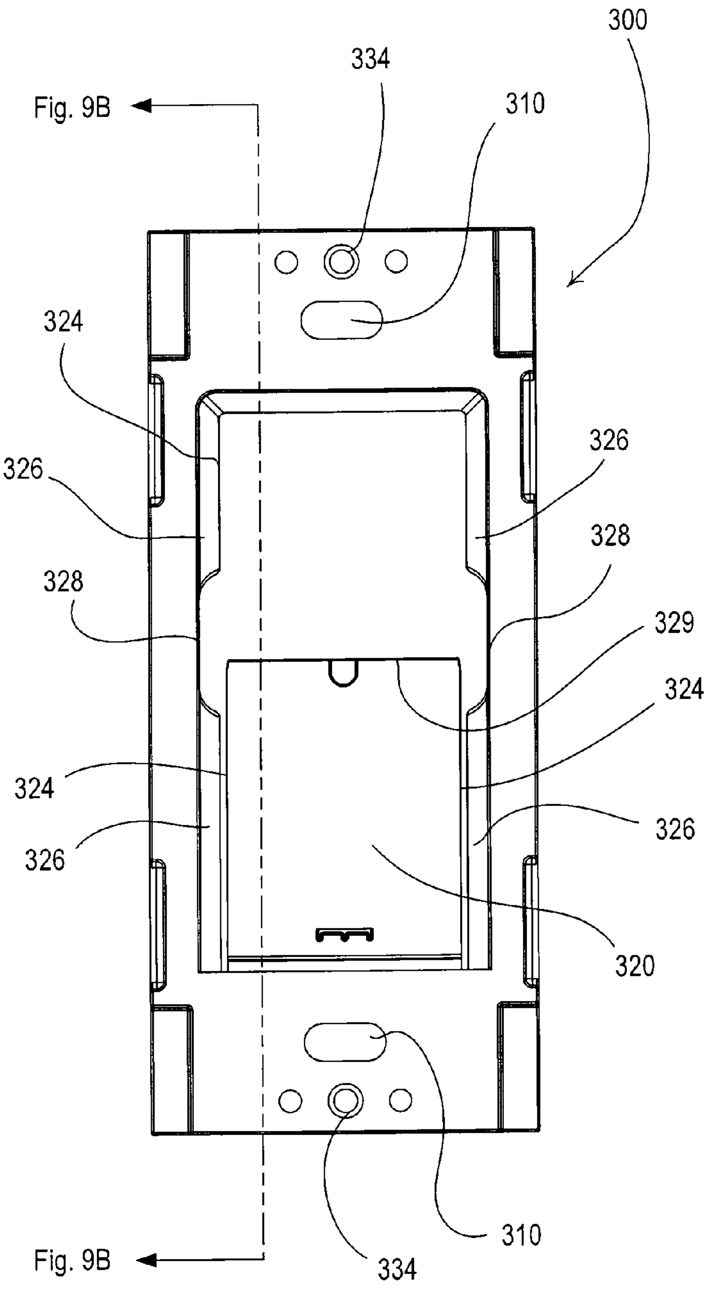
FIG. 9A is a front view of the mounting structure of FIGS. 5-8.
Figure 9B:
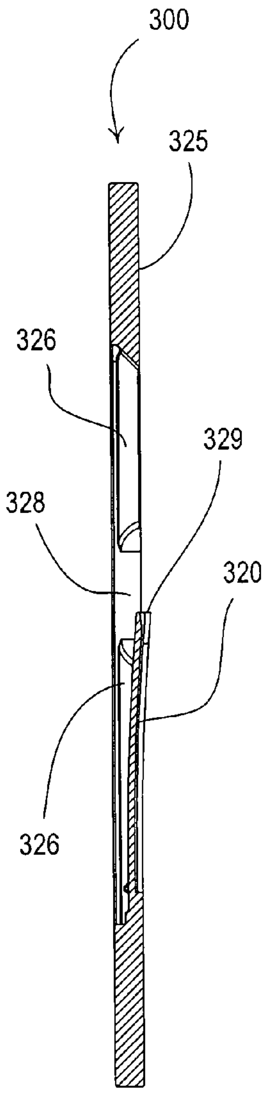
FIG. 9B is a right-side cross-sectional view of the mounting structure of FIG. 9A.

FIG. 9A is a front view and FIG. 9B is a right-side cross-sectional view of the mounting structure 300 showing the leaf 320 in greater detail. The leaf 320 of the mounting structure 300 is preferably formed with a bias towards a rear surface 325 of the mounting structure (e.g., towards the electrical wallbox 350 when mounted as shown in FIG. 5 or the wall when mounted as shown in FIG. 6). Specifically, the leaf 320 has a reverse-oriented slant (i.e., a gentle curve) toward the rear surface 325 of the mounting structure, such that the leaf curves slightly toward the rear of the mounting structure. The reason for this bias is so that the remote control 120, when slidably received by the leaf 320 and received in the opening 322 of the mounting structure 300, is retained with a spring bias holding the remote control 120 securely in the opening in the mounting structure. In addition, the bias ensures that the front surface of the front enclosure portion 122 of the remote control 120 is substantially parallel with the front surface of the faceplate 200 when the faceplate is installed (as shown in FIG. 3). The mounting structure 300 with its integral flexible leaf 320 is preferably molded out of a high strength plastic with the required flexibility imparted into the leaf, such as, for example, polycarbinate.

Figure 7:
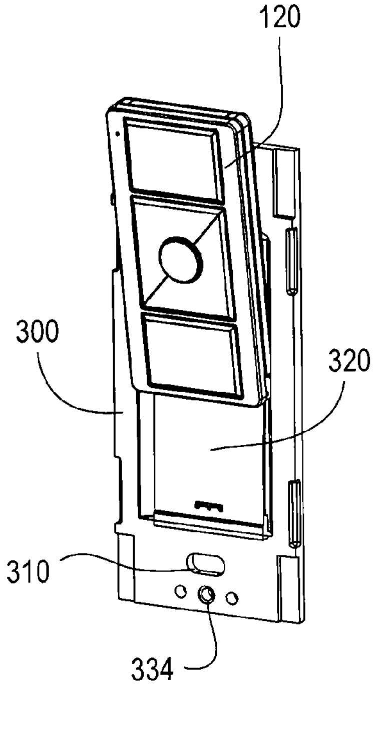
FIG. 7 is a perspective view of the remote control of FIG. 1 and the mounting structure of the first embodiment showing how the remote control is received in an opening of the mounting structure.

As shown in FIGS. 6 and 7, the opening 322 is sized slightly larger than the external dimensions of the remote control 120, and has recessed flanges 326 bordering the opening 322 and projecting into the opening. The recessed flanges 326 receive the beveled edges 125 (FIG. 2B) of the rear enclosure potion 124 of the remote control 120 when the remote control is fully slid into and received in the opening. Accordingly, the recessed flanges 326 abut against the beveled edges 125 of the remote control 120 to seat the remote control in the opening 322 in the mounting structure 300.

The mounting structure 300 includes two recesses 328 in the recessed flanges 326 in the areas of a most-upwardly disposed portion 329 of the flexible leaf 320 as shown in FIGS. 9A and 9B. The recesses 328 are provided so that when the remote control 120 is initially inserted in the opening 322, the two flanges 220 of the slide-receiving portion 210 of the remote control 120 are able to receive the edges 324 of the leaf 320, as shown in FIG. 7. Specifically, the remote control 120 can be inserted into the opening 322 at an angle to the mounting structure 300 so that the edges 324 of the leaf 320 can be received in the channels formed by the flanges 220.

As shown in FIG. 8, the mounting structure 300 can receive the adaptor plate 204, which is fastened to the mounting structure by suitable screws 330 disposed through openings 332 and received in threaded openings 334 in the mounting structure. The adaptor plate 204 includes snap fastener recesses 336 which receive projections (not shown) formed on the rear of the faceplate 200. An opening 338 in the adaptor plate 204 is sized substantially the same as the front opening 202 in the faceplate 200, such that the opening 338 suitably frames the remote control 120 when the remote control is fastened to the mounting structure 300. The faceplate 200 provides a finished appearance for the mounting structure 300 so that no mounting screws are shown. Alternatively, another faceplate could be provided, without the faceplate adaptor 204, that mounts directly to the mounting structure 300 via screws which mount into the threaded openings 334 of the mounting structure.

During installation, the remote control 120 is disposed at an angle to the mounting structure 300 (as shown in FIG. 7), so that the bottom of the remote control is received in the recesses 328 and the flanges 220 of the slide-receiving portion 210 receive the edges 324 of the leaf 320 (as shown in FIG. 7). The remote control 120 is then further slid onto the leaf 320 and pushed firmly downwardly completely onto the leaf 320 until the remote control sits in the opening 322 on the flanges 326 in the mounting structure 300 (as shown in FIG. 5). At this time, the adapter plate 204 may be connected to the mounting structure 300 and the faceplate 200 may be snapped on the adapter plate, such that the remote control 120 is framed in the opening 202 of the faceplate (as shown in FIG. 3). Once the remote control 120 is recessed in the opening 202 the faceplate 200, the remote control cannot be easily removed because the remote control is retained firmly in place by the reverse bias of the leaf 320. However, the remote control 120 can be removed by first removing the faceplate 200 and the adaptor plate 202 and then suitably grasping the top of the remote control 120 with one's fingernails in order to move the remote control forward against the bias of the flexible leaf 320. The remote control 120 may then be slide off of the flexible leaf 320.

Figure 10:
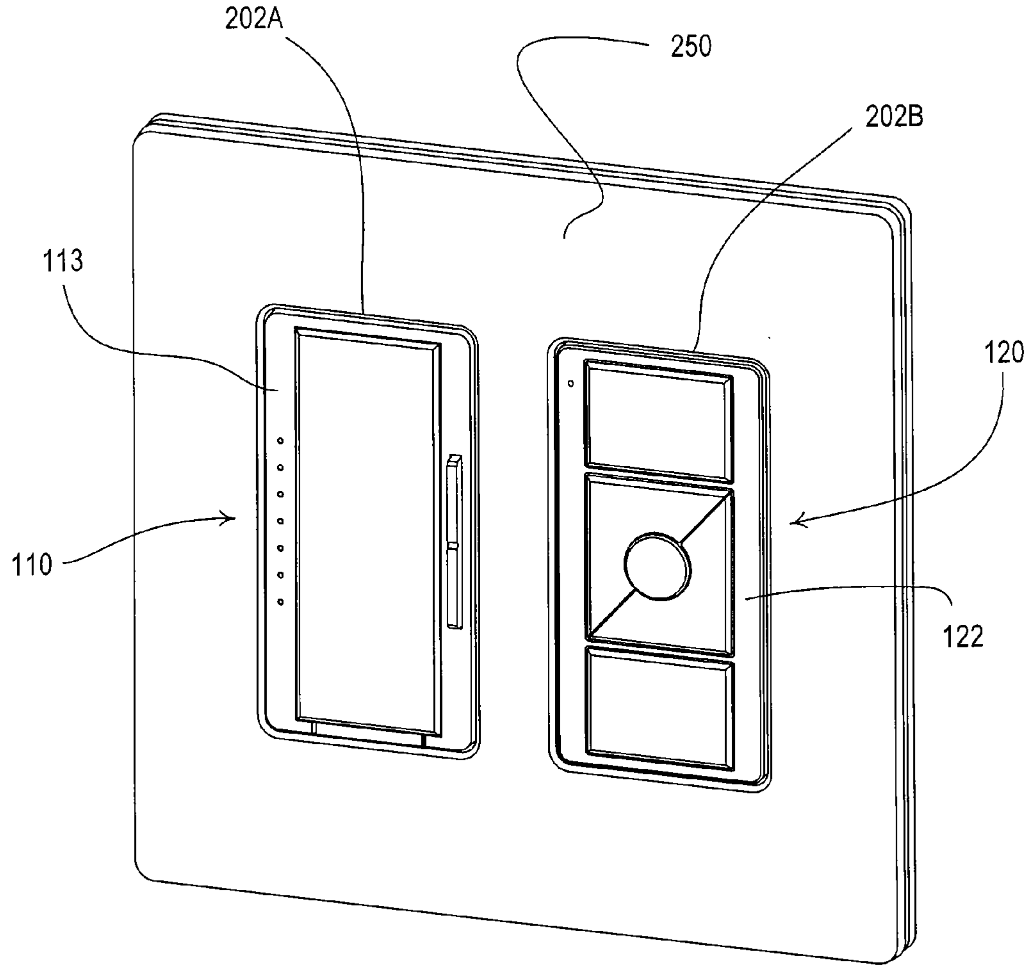
FIG. 10 is a perspective view of the remote control of FIG. 1 ganged next to a designer-style dimmer switch and mounted with a standard designer-style two-gang faceplate.

The remote control 120 may be ganged next to a designer-style load control device (e.g., the dimmer switch 110) with a standard designer-style multigang faceplate (e.g., a two-gang faceplate 250) as shown in FIG. 10. The dimmer switch 110 is mounted to a standard multigang electrical wallbox (not shown) that is provided in the wall. The remote control 120 is mounted in the wallbox space immediately adjacent the dimmer switch 110 using the mounting structure 300. The two-gang faceplate 250 has first and second designer-style openings 202A, 202B and is mounted such that the bezel 113 of the dimmer switch 110 is provided in the first opening 202A and the remote control 120 is provided in the second opening 202B. The bezel 113 of the dimmer switch 110 has a length and a width slightly smaller than the length and the width of the first opening 202A of the faceplate 250. A two gang wallbox mounted faceplate is shown in FIG. 10, but larger multigang faceplates are also usable with the invention.

Figure 11:
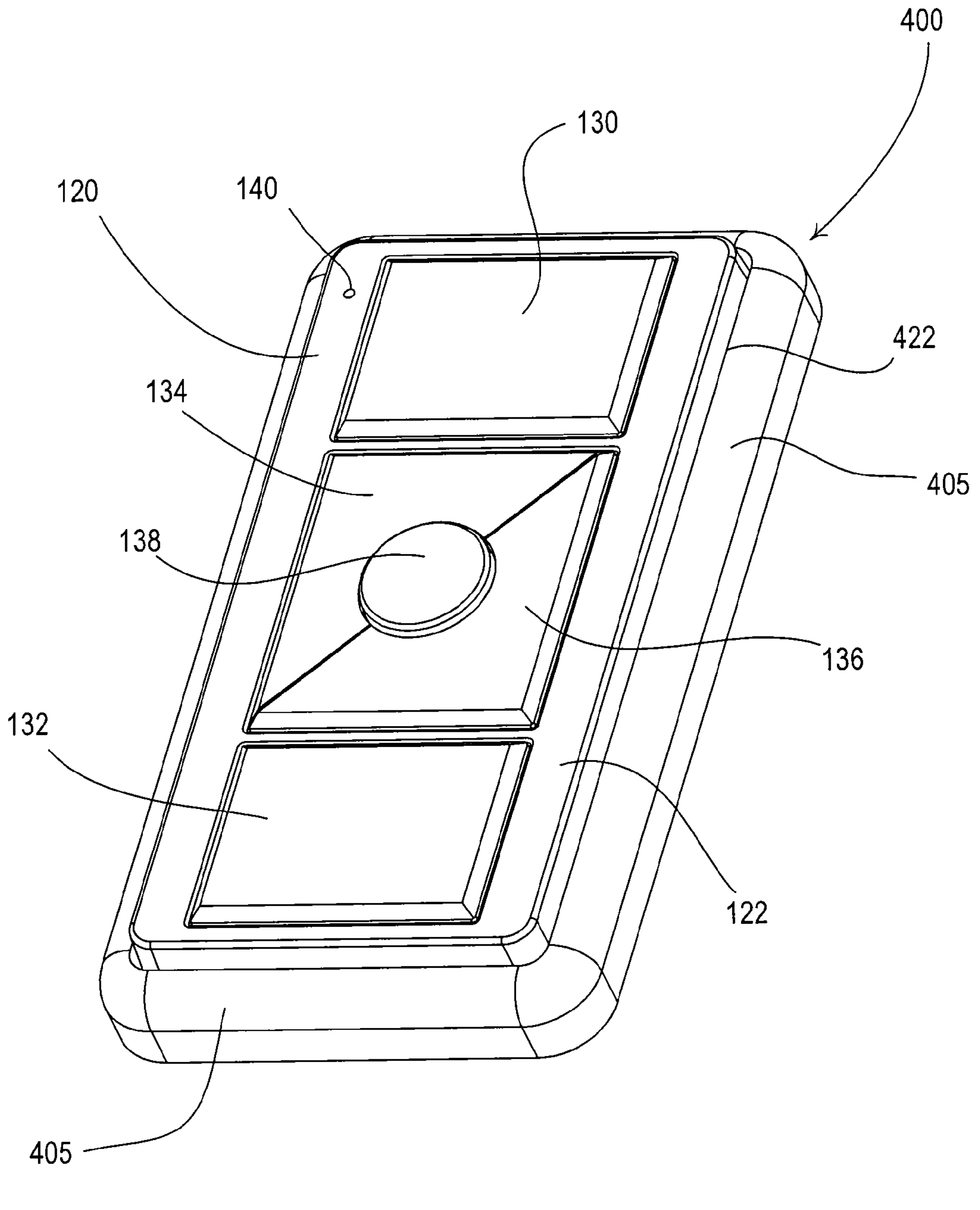
FIG. 11 is a perspective view of the remote control of FIG. 1 mounted with a mounting structure according to a second embodiment of the present invention.
Figure 12:
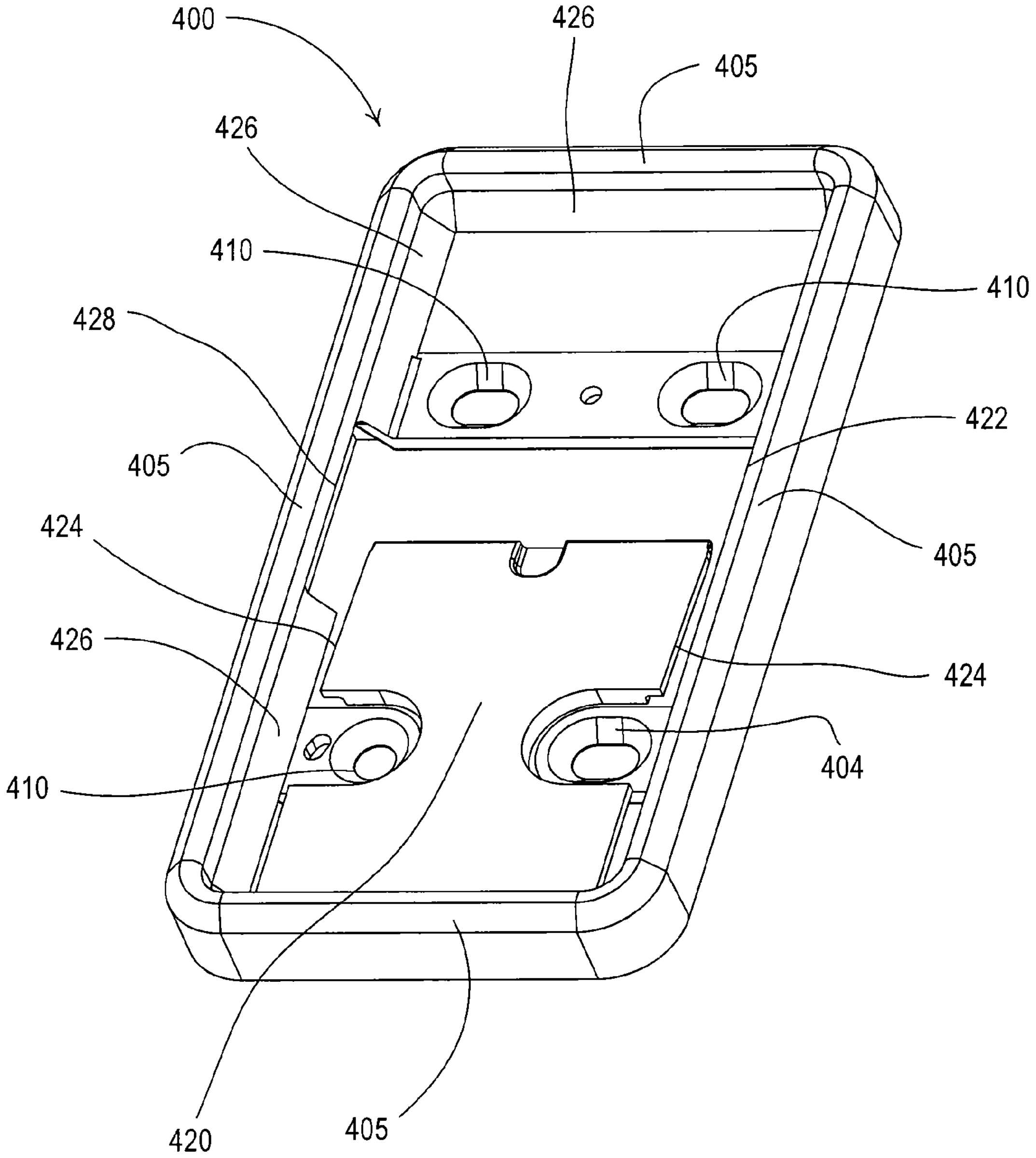
FIG. 12 is a perspective view of the mounting structure of FIG. 11 without the remote control installed.

FIG. 11 is a perspective view of the remote control 120 mounted with a mounting structure 400 according to a second embodiment of the present invention. The mounting structure 400 comprises a small frame 405 that surrounds the remote control 120. FIG. 12 is a perspective view of the mounting structure 400 without the remote control 120 installed. The mounting structure 400 comprises openings 410 through which mounting screws (not shown) extend to secure the mounting structure to a surface (e.g., using anchors 316 as shown in FIG. 6). The mounting structure 400 includes a flexible integrally-formed leaf 420 in an opening 422. The flanges 220 of the slide-receiving portion 210 of the remote control 120 receive edges 424 of the leaf 420, such that the remote control may be slidably fastened to the leaf. The leaf 420 is preferably biased towards the rear of the mounting structure 400 (in a similar manner as the leaf 320 of the mounting structure 300 of the first embodiment). The mounting structure 400 has recessed flanges 426 and two recesses 428 in the flanges that allow the remote control to be inserted into the opening 422 of the mounting structure 400, such that the leaf 420 may be received in the slide-receiving portion 210 of the remote control 120.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A mounting structure for mounting a remote control device to a vertical surface, the remote control device operating a load control device of a wirelessly controlled lighting control system, the mounting structure comprising:

a mounting fixture for attaching to the vertical surface;

an opening in the mounting fixture sized to receive the remote control device; and a flexible leaf in the opening that receives the remote control device whereby the remote control device is retained in position on the mounting structure such that the remote control device is framed by the opening in the mounting structure;

wherein the flexible leaf projects upwardly in the opening for receiving a flanged recess of the remote control device disposed on a rear surface of the remote control device, whereby the remote control device is slidably received on the flexible leaf and when fully received on the leaf is retained in position on the mounting structure such that the remote control device is framed by the opening in the mounting fixture.

2. The mounting structure of claim 1, wherein the remote control device has a recess in a rear portion thereof that opens to the bottom of the remote control device, the recess having flanges on two sides thereof that form channels opening toward the bottom of the recess for slidably receiving two vertical edges of the flexible leaf of the mounting structure.

3. The mounting structure of claim 2, further wherein the mounting structure has flanges at the rear of the opening bordering the opening and projecting into the opening and having recesses in the flanges in the areas of the most upwardly disposed portion of the flexible leaf, whereby the remote control device can be inserted at an angle to the mounting structure into the opening and such that the mounting structure is disposed in the recesses whereby the channels can slidably receive the vertical edges of the flexible leaf.

4. The mounting structure of claim 3, wherein the flanges bordering the opening are disposed so as to abut against the remote control device to seat the remote control device in the opening in the mounting structure.

5. The mounting structure of claim 4, wherein the flanges are beveled to receive a beveled rear edge of a housing of the remote control device.

6. The mounting structure of claim 3, wherein the flexible leaf is reduced in thickness at the vertical edges to receive the channels of the remote control device.

7. The mounting structure of claim 1, wherein the flexible leaf has a reverse-oriented slant toward a rear surface of the mounting structure.

8. The mounting structure of claim 7, wherein the reverse-oriented slant comprises a gentle curve of the flexible leaf toward the rear surface of the mounting structure.

9. The mounting structure of claim 1, wherein the vertical surface is adapted to have an electrical wallbox mounted thereto, the mounting structure adapted to be mounted across an opening of the electrical wallbox, the mounting fixture comprising openings for receiving mounting screws, such that the mounting structure mounts to the electrical wallbox with the screws.

10. The mounting structure of claim 1, wherein the flexible leaf provides a bias to the remote control device such that the remote control device is retained in the opening with a bias that provides a rearward force to the remote control device.

11. A control structure comprising:

a remote control device adapted to operate a load control device of a wirelessly controlled lighting control system;

a mounting fixture adapted to be attached to a vertical surface;

an opening in the mounting fixture sized to receive the remote control device; and a flexible leaf in the opening that receives the remote control device whereby the remote control device is retained in position such that the remote control device is framed by the opening in the mounting fixture;

wherein the flexible leaf projects upwardly in the opening for receiving a flanged recess of the remote control device disposed on a rear surface of the remote control device, whereby the remote control device is slidably received on the flexible leaf and when fully received on the leaf is retained in position on the control structure such that the remote control device is framed by the opening in the mounting fixture.

12. The control structure of claim 11, further comprising:

a faceplate mounted to the mounting fixture.

13. The control structure of claim 12, further comprising:

a faceplate adaptor plate mounted to the mounting fixture and wherein the faceplate mounts to the faceplate adaptor plate.

14. The control structure of claim 13, wherein the faceplate mounts to the faceplate adaptor plate with a snap fit, and the faceplate adaptor mounts to the mounting fixture with screws.

15. The control structure of claim 11, wherein the remote control device comprises a recess in a rear portion thereof that opens to the bottom of the remote control device, the recess having flanges on two sides thereof that form channels opening toward the bottom of the recess for slidably receiving two vertical edges of the flexible leaf of the control structure.

16. The control structure of claim 11, further comprising:

an electrical wallbox mounted to the vertical surface, the control structure being adapted to be mounted across an opening of the electrical wallbox.

17. The control structure of claim 16, wherein the mounting fixture comprises openings for receiving mounting screws, such that the control structure mounts to the electrical wallbox with the screws.

18. The control structure of claim 11, wherein the flexible leaf is biased towards a rear surface of the mounting fixture.

* * * * *